(12) United States Patent
Kim et al.

(10) Patent No.: US 7,436,240 B2
(45) Date of Patent: Oct. 14, 2008

(54) CAPACITANCE MULTIPLIER

(75) Inventors: Young-Jin Kim, Yongin-si (KR); In-Chul Hwang, Seoul (KR); Han-Il Lee, Gyeonggi-do (KR); Jae-Heon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/506,034

(22) Filed: Aug. 17, 2006

(65) Prior Publication Data

US 2006/0273845 A1 Dec. 7, 2006

Related U.S. Application Data

(62) Division of application No. 10/941,357, filed on Sep. 15, 2004, now Pat. No. 7,113,022.

(30) Foreign Application Priority Data

Sep. 15, 2003 (KR) ............................ 2003-0063579
Jan. 5, 2004 (KR) ............................ 2004-0000228

(51) Int. Cl.
*G05F 1/10* (2006.01)
(52) U.S. Cl. ...................................... 327/536; 327/538
(58) Field of Classification Search ................. 327/536, 327/538, 540, 541, 543; 363/59, 60; 307/110
See application file for complete search history.

(56) References Cited

U.S. PATENT DOCUMENTS 6,778,004 B1 * 8/2004 Jackson ....................... 327/538
6,806,762 B2 * 10/2004 Stair et al. ................... 327/538

* cited by examiner

*Primary Examiner*—Kenneth B. Wells
(74) *Attorney, Agent, or Firm*—Monica H. Choi

(57) ABSTRACT

A capacitance multiplier includes a self-biasing active load for generating a stable bias voltage without a separate current bias. In addition, the capacitance multiplier includes a cascode load within a multiplying section for increasing the output resistance and in turn the charging/discharging efficiency. Furthermore, the capacitance multiplier is implemented with a plurality of multiplying paths to reduce effects of noise for more stable generation of the multiplied capacitance.

12 Claims, 12 Drawing Sheets

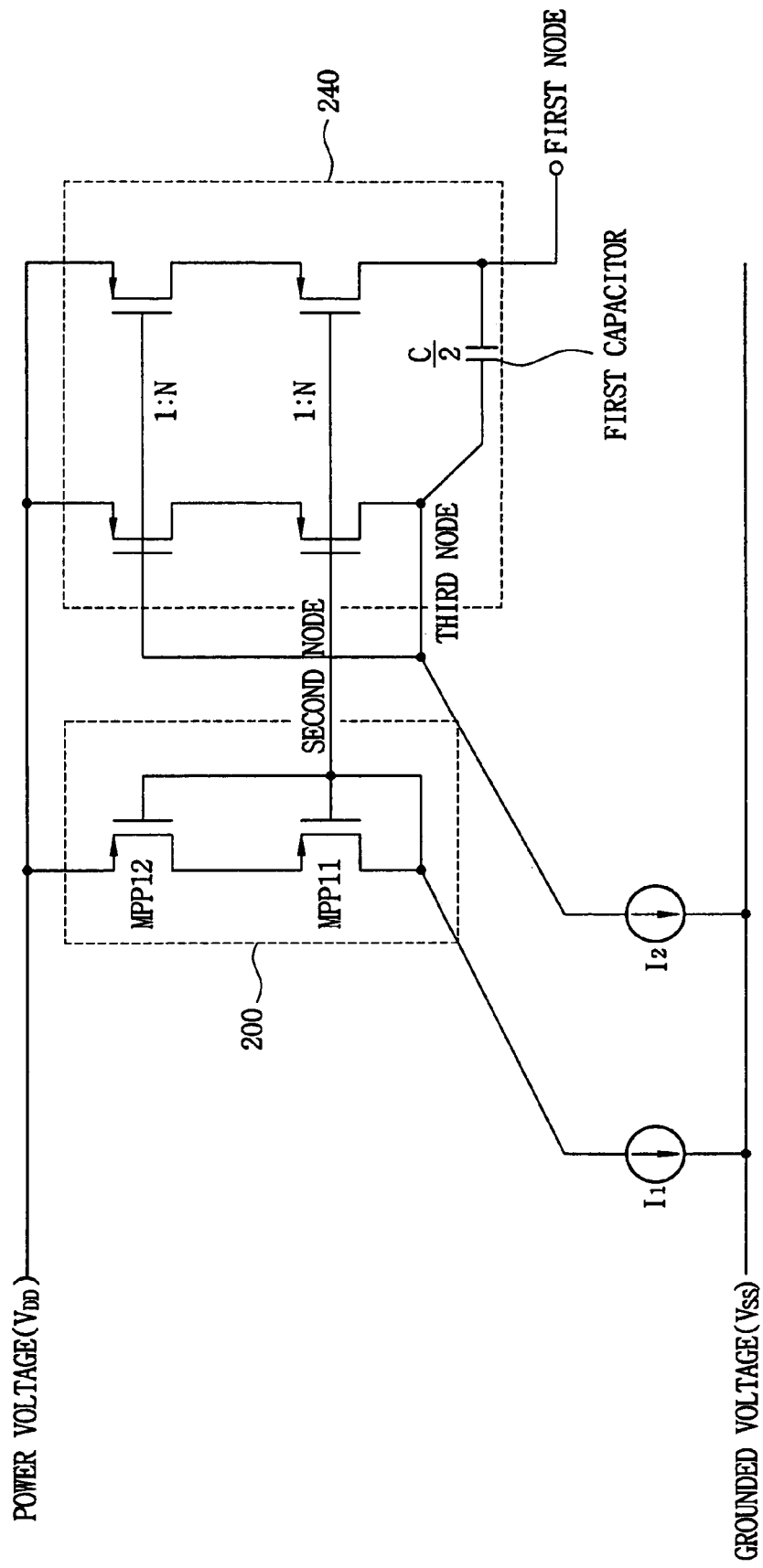

US 7,436,240 B2

CAPACITANCE MULTIPLIER

The present application is a divisional of an earlier filed patent application with Ser. No. 10/941,357 filed on Sep. 15, 2004, now issued as U.S. Pat. No. 7,113,022, for which priority is claimed. This earlier filed patent application with Ser. No. 10/941,357 is in its entirety incorporated herewith by reference.

The present application also claims priority under 35 USC § 119 to Korean Patent Application No. 2003-0063579 and Korean Patent Application No. 2004-0000228, filed on Sep. 15, 2003 and Jan. 5, 2004 respectively, the contents of which are incorporated herein in their entirety by reference. Certified copies of Korean Patent Application Nos. 2003-0063579 and 2004-0000228 are contained in the parent patent application with Ser. No. 10/941,357.

BACKGROUND OF THE INVENTION

1. Field of the Invention

The present invention relates generally to a capacitance multiplier, and more particularly to a capacitance multiplier having self-biasing, cascode loads, and/or a plurality of multiplying paths, for higher efficiency in generating the multiplied capacitance.

2. Description of the Related Art

A capacitance multiplier is a circuit that multiplies a capacitance of a capacitor. FIG. 1A is a circuit diagram illustrating a conventional capacitance multiplier, and FIG. 1B illustrates a small-signal model of the capacitance multiplier of FIG. 1A.

Such a capacitance multiplier is discussed in detail in a document, Sergio Solis-Bustos, Jose Silva-Martinez, Franco Maloberti, and Edgar Sanchez-Sinencio, "A 60-dB Dynamic-Range CMOS Sixth-Order 2.4-Hz Low-Pass Filter for Medical Applications", IEEE Transactions on Circuits and Systems II, vol. 47, no. 12, December 2000.

Referring to FIG. 1A, a level of current flowing through a first PMOS transistor MP1 influences operation of a second PMOS transistor MP2. Operation of the first PMOS transistor MP1 is influenced by a level of a bias current $I_{BIAS}$ which also then influences operation of the second PMOS transistor MP2.

On the other hand, a level of current flowing through the first NMOS transistor MN1 influences operation of a second NMOS transistor MN2. Thus, operations of the PMOS and NMOS transistor MP2 and MN2 are influenced by levels of different bias currents. As a result, when the PMOS and NMOS transistors MP2 and MN2 are mismatched, the capacitance multiplier of FIG. 1A may not operate with stability.

Referring to FIG. 1B, by small-signal analysis, a total current flowing in a first node is expressed as follows:

$$i_{in} = (1+N) \times \frac{S \times C_i}{1 + s \times C_i / g_{mn1}} \times V_{in},$$

where $i_{in}$ and $v_{in}$ are a current and a voltage, respectively, at the first node. $g_{mn1}$ is the transconductance of the first NMOS transistor MN1 when leakage currents flowing through the PMOS and NMOS transistors MP2 and MN2 are negligible.

N is a size multiplication ratio between the PMOS transistors MP1 and MP2, and between the NMOS transistors MN1 and MN2. Thus, the W/L (width to length ratio) of the second PMOS transistor MP2 is N times the W/L of the first PMOS transistor MP1. Similarly, the W/L of the second NMOS transistor MN2 is N times the W/L of the first NMOS transistor MN1.

Here, a bandwidth of the capacitance multiplier of FIGS. 1A and 1B is expressed as follows: $w=g_{mn1}/C_i$. In this manner, an output capacitance of $C_i*(N+1)$ within the above bandwidth is generated at the first node.

Unfortunately, the capacitance multiplier of FIGS. 1A and 1B has a relatively narrow bandwidth and requires a relatively high area for a bias circuit comprised of the current source for $I_{BIAS}$ and the extra MOS transistors MP3, MN3, and MN4. As a result, when the prior art capacitance multiplier is integrated into an application system such as a frequency synthesizer, a chip size of the application system is greatly increased. Hence, it is desired to increase a bandwidth of a capacitance multiplier but also with a reduced area.

SUMMARY OF THE INVENTION

Accordingly, a capacitance multiplier includes self-biasing, cascode loads, and/or a plurality of multiplying paths for efficiency in generating the multiplied capacitance with higher bandwidth, reduced area, and/or higher output resistance.

In one aspect of the present invention, a capacitance multiplier includes a capacitor having a first capacitance, C, coupled between a first node and a second node. In addition, an active load is coupled to the second node for generating a bias voltage thereon with self biasing from a first current level, I, flowing within the active load. Furthermore, a multiplying section is coupled to the first and second nodes for generating a second capacitance, $(N+1)*C$, at the first node with a second current level, $N*I$, flowing within the multiplying section.

In an example embodiment of the present invention, the active load of the capacitance multiplier includes a PMOS transistor coupled between a high voltage source and the second node and includes an NMOS transistor coupled between a low voltage source and the second node. In that case, a bandwidth of the capacitance multiplier is $(g_{mn}+g_{mp})/C$ such that the bandwidth is increased from the prior art, with $g_{mn}$ being the transconductance of the NMOS transistor of the active load, and with $g_{mp}$ being the transconductance of the PMOS transistor of the active load. The first current level, I, flows through the PMOS and NMOS transistors of the active load.

In another embodiment of the present invention, the multiplying section of the capacitance multiplier includes a PMOS transistor coupled between the high voltage source, the second node, and the first node. The multiplying section also includes an NMOS transistor coupled between the low voltage source, the second node, and the first node. The second current level, $N*I$, flows through the PMOS and NMOS transistors of the multiplying section.

In further embodiment of the present invention, the active load of the capacitance multiplier includes a bias cascode of PMOS transistors coupled between a high voltage source and the second node. The active load also includes a bias cascode of NMOS transistors coupled between a low voltage source and the second node. The first current level, I, flows through the bias cascodes of the active load.

In another embodiment of the present invention, the multiplying section of the capacitance multiplier also includes a PMOS cascode of PMOS transistors coupled between the high voltage source, the second node, and the first node. The multiplying section also includes an NMOS cascode of NMOS transistors coupled between the low voltage source, the second node, and the first node. The second current level, N*I, flows through the PMOS and NMOS cascodes of the multiplying section.

In this manner, with the active load being self-biasing, a separate current bias is not used for minimizing area of the capacitance multiplier. In addition, with use of cascodes, the output resistance is increased for higher charging/discharging efficiency.

In another aspect of the present invention, a capacitance multiplier includes a plurality of capacitors, each capacitor coupled to a first node and having a respective first capacitance, Ci. The capacitance multiplier also includes a respective bias voltage section for each capacitor for generating a respective bias voltage. The capacitance multiplier further includes a respective multiplying section for each capacitor for generating a respective second capacitance, (Ni+1)*Ci, at the first node by multiplying a respective Ni with a current level, I, flowing through the multiplying section that is determined by the respective bias voltage.

In such an embodiment, a total capacitance at the first node is a sum of the respective second capacitances for the plurality of capacitors such that effects of noise may be reduced for more stable generation of the multiplied capacitance.

BRIEF DESCRIPTION OF THE DRAWINGS

The above and other features and advantages of the present invention will become more apparent by describing in detail exemplary embodiments thereof with reference to the accompanying drawings, in which:

FIG. 9 is a circuit diagram of a bias current section, a first bias voltage section, and a first multiplying section of FIG. 6, according to another embodiment of the present invention;

The figures referred to herein are drawn for clarity of illustration and are not necessarily drawn to scale. Elements having the same reference number in FIGS. 1A, 1B, 2, 3, 4, 5, 6, 7, 8A, 8B, 8C, 8D, 9, 10, and 11 refer to elements having similar structure and/or function.

DETAILED DESCRIPTION OF THE INVENTION

Figure 2:
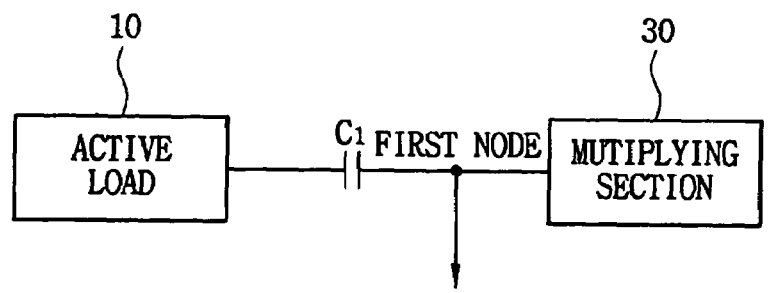
FIG. 2 is a block diagram of a capacitance multiplier with an self-biasing active load, according to an embodiment of the present invention.

FIG. 2 is a block diagram of a capacitance multiplier with a self-biasing active load 10 according to an embodiment of the present invention. Referring to FIG. 2, the capacitance multiplier also includes a capacitor $C_1$ and a multiplying section 30. The active load 10 is self-biasing because the active load 10 generates a bias voltage without using a separate bias current, for a reduced area and higher stability. A first node is an I/O (input-output) terminal having the multiplied capacitance generated thereon. The multiplying section 30 multiplies a capacitance, C, of the capacitor $C_1$.

Figure 3:
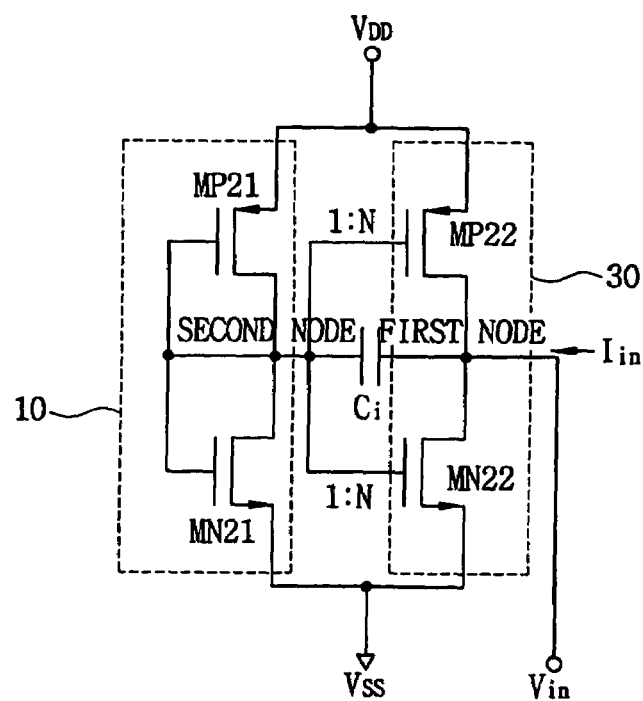
FIG. 3 is a circuit diagram of a capacitance multiplier with an self-biasing active load, according to an embodiment of the present invention.

FIG. 3 is a circuit diagram for an example implementation of the capacitance multiplier of FIG. 2. Referring to FIG. 3, the active load 10 includes a first PMOS transistor MP21 and a first NMOS transistor MN21. The first PMOS transistor MP21 has a source coupled to a high voltage source $V_{DD}$, and has a gate and a drain coupled together to a second node. The first NMOS transistor MN21 has a source coupled to a low voltage source $V_{SS}$ (such as ground), and has a drain and a gate coupled together to the second node.

The multiplying section 30 includes a second PMOS transistor MP22 and a second NMOS transistor MN22. The second PMOS transistor MP22 has a source coupled to a high voltage source $V_{DD}$, and has a gate and a drain coupled to the second node and a first node, respectively. The first nodes of FIGS. 2 and 3 are similar. The second NMOS transistor MN22 has a source, a gate, and a drain coupled to the low voltage source $V_{SS}$, the second node, and the first node, respectively.

The size ratio of the first PMOS transistor MP21 to the second PMOS transistor MP 22 is equal to 1:N, N being a positive integer. Thus, the W/L (width to length ratio) of the second PMOS transistor MP2 is N times the W/L of the first PMOS transistor MP1. The size ratio of the first NMOS transistor MN 21 to the second NMOS transistor MN 22 is equal to 1:N. Thus, the W/L of the second NMOS transistor MN2 is N times the W/L of the first NMOS transistor MN1. A capacitor, with capacitance $C_i$, is coupled between the first node and the second node.

The capacitance multiplier of FIG. 3 operates with the active load 10 generating the bias voltage applied on the second node. Generation of such a bias voltage without using a separate bias current is now described. Assuming that the transistors MP21 and MN21 operate in saturation, I=K ($V_{GS}$-$V_{TH}$)$^2$, and such an expression for the level of current, I, flowing through the transistors MP21 and MN21 operating in saturation is known to one of ordinary skill in the art.

As shown in FIG. 3, the gates of the PMOS and NMOS transistors MP21 and MN21 are coupled together to the second node. In addition, the sources of such transistors MP21 and MN 21 are coupled between the high and low voltage sources $V_{DD}$ and $V_{SS}$. Thus, each gate-to-source voltage $V_{GS}$ for the transistors MP21 and MN21 is a constant value. In addition, each threshold voltage of the transistors MP21 and MN21 is predetermined. As a result, the level of current, I, flowing through the transistors MP21 and MN21 is determined.

Furthermore, because each of the transistors MP21 and MN21 has the drain and the gate coupled together, the bias voltage at the second node may swing between the high voltage $V_{DD}$ and the low voltage $V_{SS}$ with stable operation.

When a current level, I, flows through the first PMOS transistor MP21, the current level flowing through the second NMOS transistor MN22 is N×I (i.e. N times as large as the current level I). In addition, the gates of the first and second PMOS transistors MP21 and MP22 and the first and second NMOS transistors NM21 and NM22 are coupled together to the second node. Thus, the voltage at the first node is substantially equal to the voltage at the second node.

Because each of the first PMOS and NMOS transistors MP21 and MN21 have the drain and gate coupled together, such transistors MP21 and MN21 operate in saturation irrespective of voltage variations at the voltage sources $V_{DD}$ and $V_{SS}$ or a mismatch between the transistors MP21 and MN21 (i.e. $|V_{DS}| \geq |V_{GS} - V_{TH}|$). Thus, a constant current level flows through such transistors MP21 and NM21 such that the bias voltage generated at the first and second nodes is stable irrespective of voltage variations at the voltage sources $V_{DD}$ and $V_{SS}$ or a mismatch between the transistors MP21 and MN21.

By small-signal analysis of the capacitor multiplier of FIG. 3, a total current at the first node is expressed as follows:

$$i_{in} = (1+N) \cdot \frac{sC_i}{1 + s\frac{C_i}{g_{mn1} + g_{mp1}}} \cdot v_{in},$$

where $i_{in}$ and $v_{in}$ represent a current and a voltage, respectively, at the first node, $g_{mn1}$ represents a transconductance of the first NMOS transistor MN21, and $g_{mp1}$ represents a transconductance of the first PMOS transistor MP21.

Thus, a bandwidth (i.e., the −3 dB frequency) of the capacitance multiplier of FIG. 3 is expressed as follows: $\omega_{-3dB} = (g_{mn1} + g_{mp1})/C_i$. Such a bandwidth of the capacitance multiplier of FIG. 2 is increased from that of the conventional capacitance multiplier of FIG. 1A.

In this manner, the active load 10 generates a stable bias voltage on the second node without using a separate biasing current thereby reducing the area for the capacitor multiplier of FIG. 3. In addition, the bandwidth of the capacitance multiplier of FIG. 3 is increased from that of the prior art.

Figure 4:
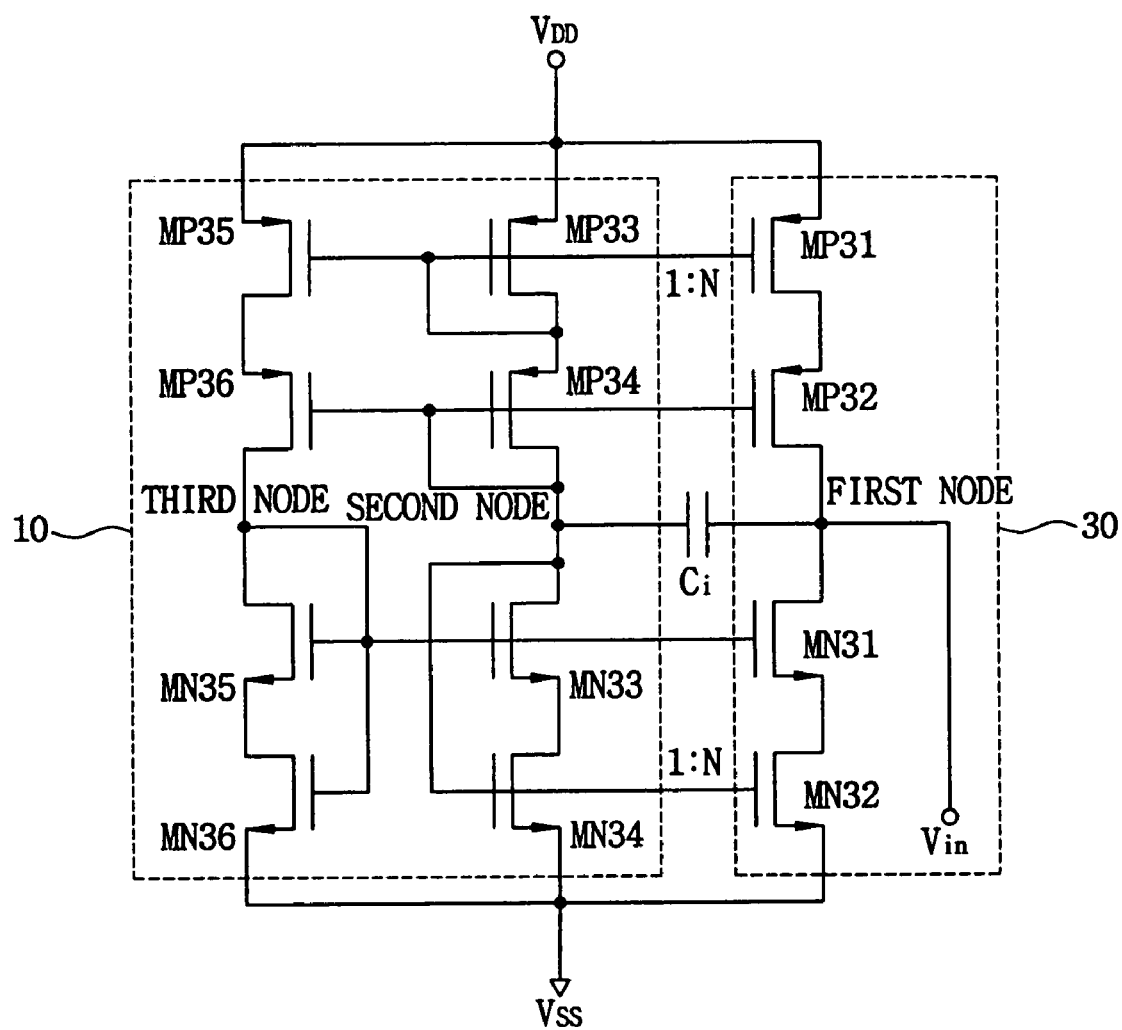
FIG. 4 is a circuit diagram of a capacitance multiplier with a self-biasing active load and with cascode loads, according to an embodiment of the present invention.

FIG. 4 is a circuit diagram of an exemplary capacitance multiplier of FIG. 2 using cascode loads according to another embodiment of the present invention. Referring to FIG. 4, the active load 10 includes first, second, third, and fourth PMOS transistors MP35, MP36, MP33 and MP34, respectively. The active load 10 also includes first, second, third, and fourth NMOS transistors MN35, MN36, MN33 and MN34, respectively.

The first PMOS transistor MP35 has a source, a gate, and a drain coupled to the high voltage source $V_{DD}$, a gate of the third PMOS transistor MP33, and a source of second PMOS transistor MP36, respectively. The second PMOS transistor MP36 also has a gate and a drain coupled to a gate of the fourth PMOS transistor MP34 and a drain of the first NMOS transistor MN35, respectively. The third PMOS transistor MP33 has a source and a drain coupled to the high voltage source $V_{DD}$ and a source of the fourth PMOS transistor MP34, respectively. The drain and the gate of the third PMOS transistor MP33 are coupled together. The fourth PMOS transistor MP34 has a drain coupled to a drain of the third NMOS transistor MN33, and the drain and a gate of the fourth PMOS transistor MP34 are coupled together.

The first and second PMOS transistors MP35 and MP36 form a first PMOS cascode of the active load 10. The third and fourth PMOS transistors MP33 and MP34 form a PMOS biasing cascode of the active load 10.

The first NMOS transistor MN35 has a drain coupled to the drain of the second PMOS transistor MP36 at a third node. The first NMOS transistor MN35 also has a gate and a source coupled to a gate of the third NMOS transistor MN33 and a drain of the second NMOS MN36, respectively. The gate and the drain of the first NMOS MN35 are coupled together. The second NMOS transistor MN36 has a gate and a source coupled to the third node and the low voltage source $V_{SS}$, respectively.

The drain of the third NMOS transistor MN33 is coupled to the drain of the fourth PMOS transistor MP 34 at the second node. The source of the third NMOS transistor MN33 is coupled to a drain of the fourth NMOS transistor MN34. The gate and the source of the fourth NMOS transistor MN34 are coupled to the second node and the low voltage source $V_{SS}$, respectively.

The first and second NMOS transistors MN35 and MN36 form a first NMOS cascode of the active load 10. The third and fourth NMOS transistors MN33 and MN34 form a NMOS biasing cascode of the active load 10.

The multiplying section 30 includes fifth and sixth PMOS transistors MP31 and MP32, respectively, and includes fifth and sixth NMOS transistors MN32 and MN32, respectively. The fifth PMOS transistor MP31 has a source, a gate, and a drain coupled to the high voltage source $V_{DD}$, the gate of the third PMOS transistor MP33, and a source of the sixth PMOS transistor MP32, respectively. The sixth PMOS transistor MP32 has a gate coupled to the gate of the fourth PMOS transistor. The drain of the sixth PMOS transistor MP32 is coupled to the drain of the fifth NMOS transistor MN31 at a first node. A capacitor with capacitance $C_i$ is coupled between the second node and the first node.

The fifth NMOS transistor MN31 has a gate and a source coupled to the gate of the third NMOS transistor MN33 and the drain of the sixth NMOS transistor MN32, respectively. The sixth NMOS transistor MN32 has a gate and a source coupled to the gate of the fourth NMOS transistor MN34 and the low voltage source $V_{SS}$, respectively.

The fifth and sixth PMOS transistors MP31 and MP32 form a PMOS cascode of the multiplying section 30, and the fifth and sixth NMOS transistors MN31 and MN32 form an NMOS cascode of the multiplying section 30. The W/L (width to length ratio) of the fifth PMOS transistor MP31 is N times the W/L of the third PMOS transistor MP33. The W/L of the sixth PMOS transistor MP32 is N times the W/L of the fourth PMOS transistor MP34. The W/L of the fifth NMOS transistor MN31 is N times the W/L of the third NMOS transistor MN33. The W/L of the sixth NMOS transistor MN32 is N times the W/L of the fourth NMOS transistor MN34.

For operation of the capacitance multiplier of FIG. 4, the active load 10 does not use a separate bias current. Rather, an integer multiple of a gate to source voltage drop ($V_{GS}$) of the bias cascodes formed by the PMOS transistors MP33 and MP34 and the NMOS transistors MN33 and MN34 are used for generating the bias voltage at the second node. In FIG. 4, the gate to source voltages of the third and fourth PMOS transistors MP33 and MP34 are coupled between the high voltage source $V_{DD}$ and the second node, and the gate to source voltage of the fourth NMOS transistor MN34 is coupled between the low voltage source $V_{SS}$ and the second node.

Figure 1A:
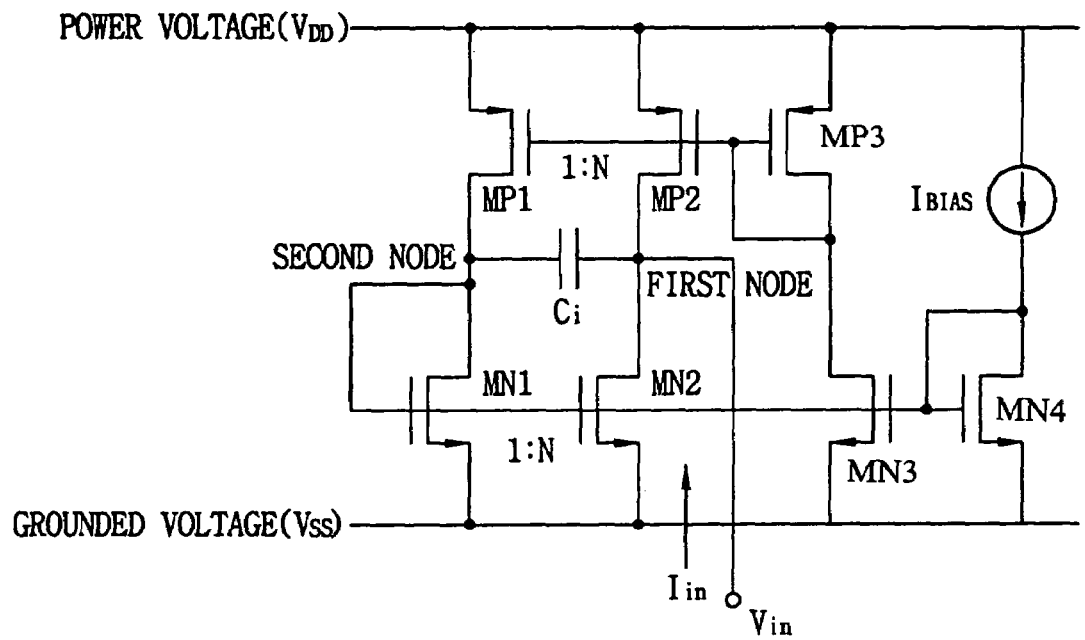
FIG. 1A is a circuit diagram of a conventional capacitance multiplier.
Figure 1B:
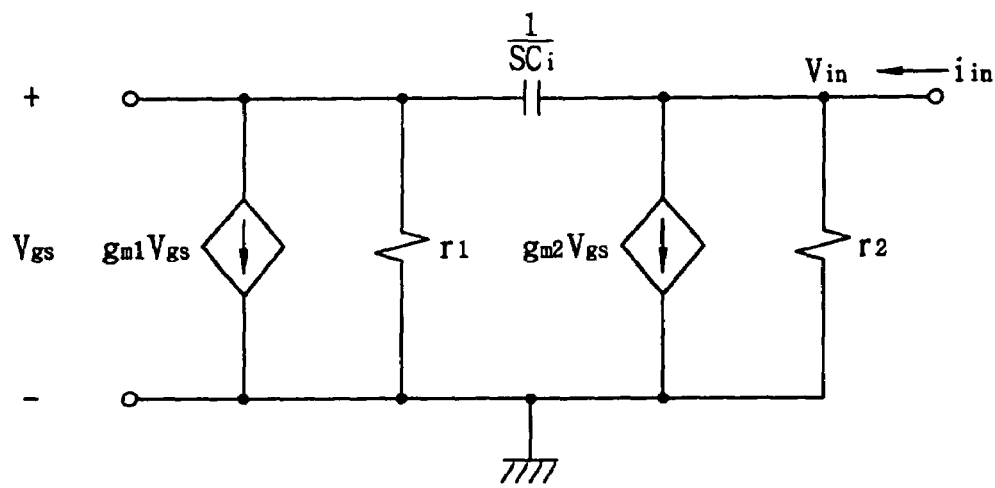
FIG. 1B is a small-signal model of the capacitance multiplier of FIG. 1A.

With such transistors MP33, MP34, and MN34 operating in saturation, the current level through each of such transistors is constant such that a constant bias voltage is generated on the second node irrespective of voltage variations at the voltage sources $V_{DD}$ and $V_{SS}$ or a mismatch between the transistors MP33, MP34, and MN34, Similar to the capacitance multiplier of FIG. 3, the capacitance generated at the first node of FIG. 4 is $(N+1)*C_i$, and the bandwidth of the capacitance multiplier of FIG. 4 is increased from the prior art of FIG. 1A. In addition, an output resistance at the first node in FIG. 4 is increased from FIG. 3 because of the cascode loads formed by the PMOS transistors MP31 and MP32 and the NMOS transistors NM31 and MN32 of the multiplying section 30. With such higher output resistance, more current is available to charge or discharge the multiplied capacitance $(N+1)*C_i$ at the first node for higher charging/discharging efficiency.

Figure 5:
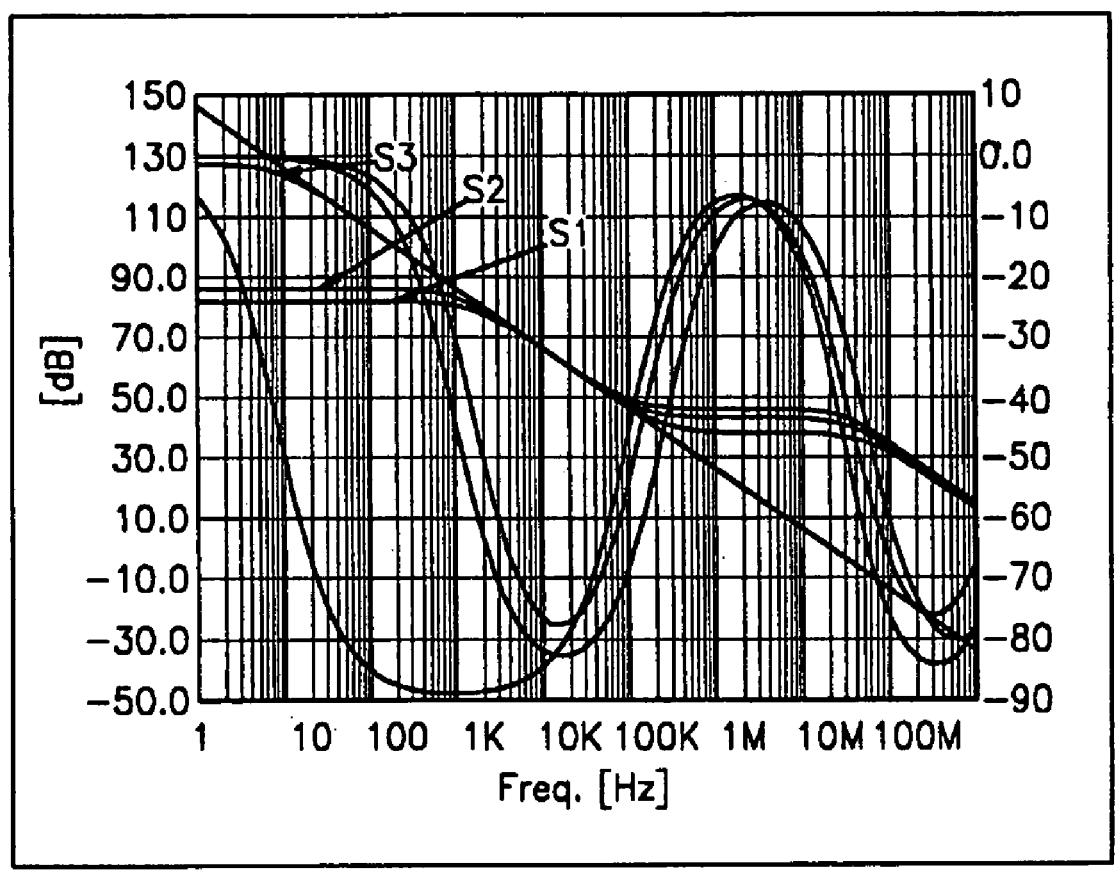
FIG. 5 shows simulation results comparing the capacitance multipliers of FIGS. 1A, 3, and 4.

FIG. 5 illustrates simulation results for the conventional capacitance multiplier of FIG. 1A and the capacitance multipliers of FIGS. 3 and 4 for embodiments of the present invention. In particular, the simulation results of FIG. 5 are generated with N set to 15 and $C_i$ set to 500 pF for a multiplied capacitance of 8 nF. FIG. 5 shows the simulation results of magnitude and phase for a frequency response of the resulting multiplied capacitance.

In FIG. 5, S1 is a simulation result for the conventional capacitance multiplier of FIG. 1A, S2 is a simulation result for the capacitance multiplier of FIG. 3, and S3 is a simulation result for the capacitance multiplier of FIG. 4. Referring to FIG. 5, the capacitance multiplier of FIG. 3 has a wider bandwidth than the conventional capacitance multiplier. In addition, FIG. 5 indicates that the capacitance multiplier of FIG. 4 generates the most ideal multiplied capacitance of the three capacitance multipliers.

Figure 6:
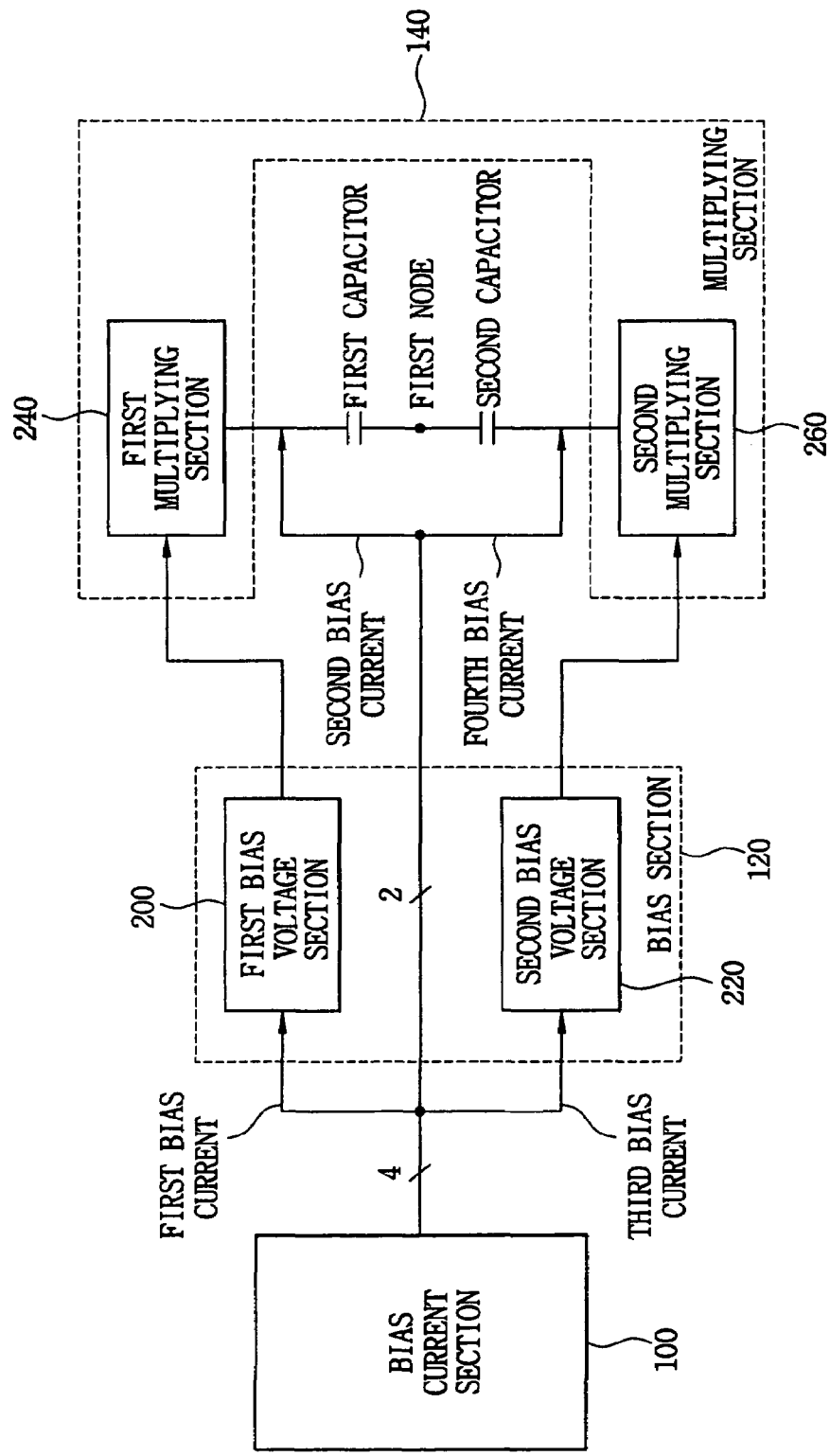
FIG. 6 is a block diagram illustrating a capacitance multiplier with a plurality of multiplying paths, according to another embodiment of the present invention.

FIG. 6 is a block diagram illustrating a capacitance multiplier having a plurality of multiplying paths according to another embodiment of the present invention. Referring to FIG. 6, the capacitance multiplier includes a bias current section 100, a bias section 120, a multiplying section 140, a first capacitor, and a second capacitor.

The bias current section 100 generates first, second, third, and fourth bias currents. The bias section 120 includes a first bias voltage section 200 and a second bias voltage section 220. Further, the multiplying section 140 includes a first multiplying section 240 and a second multiplying section 260.

The first bias voltage section 200 uses the first bias current from the bias current section 100 to generate a constant bias voltage on a predetermined node of the first multiplying section 240. The second voltage section 220 uses the third bias current from the bias current section 100 to generate a constant bias voltage on a predetermined node of the second multiplying section 240.

The first multiplying section 240 multiplies a first capacitance of the first capacitor, and the second multiplying section 260 multiplies a second capacitance of the second capacitor. An example embodiment of the multiplying sections 240 and 260 includes cascode loads for increased output resistance at the first node for enhanced DC characteristics (such as improved charging/discharging efficiency) of the multiplied capacitance at the first node.

In addition, each of the first and second capacitors coupled to the first node has a respective bias voltage section and a respective multiplying section for forming a respective multiplying path. By using multiple multiplying paths, effects of noise at the first node may be reduced for more stable generation of the multiplied capacitance at the first node.

Figure 7:
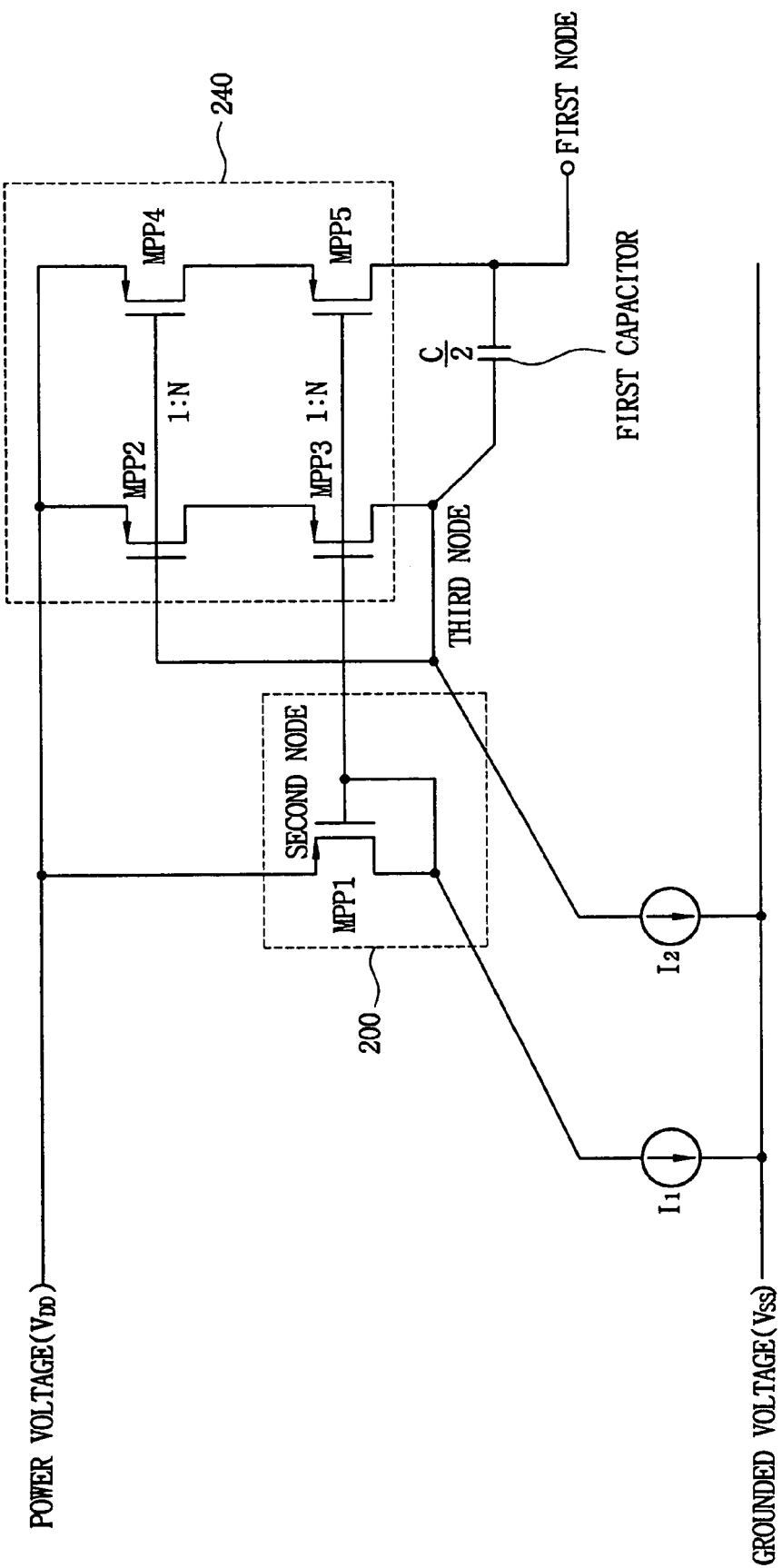
FIG. 7 is a circuit diagram of a bias current section, a first bias voltage section, and a first multiplying section of FIG. 6 according to an embodiment of the present invention.

FIG. 7 is a circuit diagram for an example embodiment of the bias current section 100, the first bias voltage section 200, and the first multiplying section 240. The bias current section 100 includes first and second current sources providing the first current $I_1$ and the second current $I_2$, respectively. The first bias voltage section 200 includes a first PMOS transistor MPP1 with a source coupled to the high voltage source $V_{DD}$, and with a drain coupled to the first current source (providing the current $I_1$) and to a gate of the first PMOS transistor MPP1.

The first multiplying section 240 includes second, third, fourth, and fifth PMOS transistors MPP2, MPP3, MPP4 and MPP5, respectively. The second PMOS transistor MPP2 has a source, a gate, and a drain coupled to the high voltage source $V_{DD}$, a third node, and a source of the third PMOS transistor MPP3, respectively. The third PMOS transistor MPP3 has a gate and a drain coupled to the gate of the first PMOS transistor MPP1 and the third node, respectively. The third node is coupled to the second current source (providing the current $I_2$).

The fourth PMOS transistor has a source, a gate, and a drain coupled to the high voltage source $V_{DD}$, the gate of the second PMOS transistor MPP2, and a source of the fifth PMOS transistor MPP5, respectively. The fifth PMOS transistor MPP5 has a gate and a drain coupled to the gate of the third PMOS transistor MPP3 and the first node, respectively. The first capacitor is coupled between the third node and the first node.

The fourth and fifth PMOS transistors MPP4 and MPP5 form a first PMOS cascode of the first multiplying section 240. The second and third PMOS transistors MPP2 and MPP3 form a second PMOS cascode of the first multiplying section 240. The W/L (width to length ratio) of the fourth PMOS transistor MPP4 is N times the W/L of the second PMOS transistor MPP2. The W/L of the fifth PMOS transistor MPP5 is N times the W/L of the third PMOS transistor MPP3.

In one embodiment of the present invention, the first capacitor has a capacitance of C/2 such that the multiplied capacitance generated at the first node of FIG. 7 is $(N+1)*C/2$.

Figure 8A:
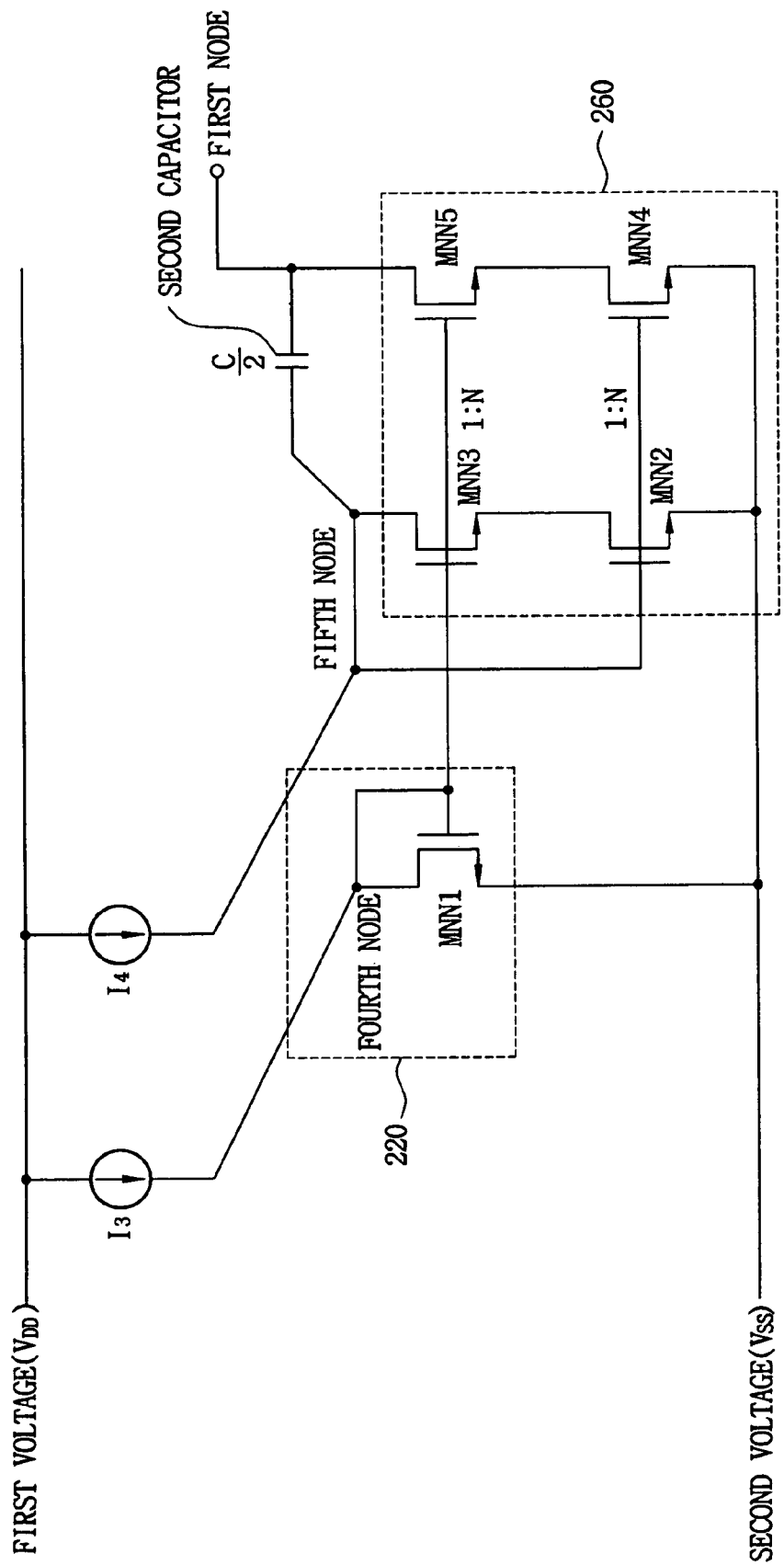
FIG. 8A is a circuit diagram of a bias current section, a second bias voltage section, and a second multiplying section of FIG. 6, according to an embodiment of the present invention.

FIG. 8A is a circuit diagram of an example embodiment of the bias current section 100, the second bias voltage section 220, and the second multiplying section 260. Referring to FIG. 8A, the bias current section 100 includes third and fourth current sources providing the third current $I_3$ and the fourth current $I_4$, respectively. The second bias voltage section 220 includes a first NMOS transistor MNN1 having a source coupled to the low voltage source $V_{SS}$. The first NMOS transistor MNN1 has a gate and a drain coupled together to the fourth node also having the third current source coupled thereon with the current $I_3$ flowing to the fourth node.

The second multiplying section 260 includes second, third, fourth, and fifth NMOS transistors MNN2, MNN3, MNN4 and MNN5, respectively. The second NMOS transistor MNN2 has a source, a gate, and a drain coupled to the low voltage source $V_{SS}$, a fifth node, and a source of the third NMOS transistor MNN3, respectively. The third NMOS transistor MNN3 has a gate and a drain coupled to the gate of the first NMOS transistor MNN1 and the fifth node, respectively. The fifth node is coupled to the fourth current source with the current $I_4$ flowing to the fifth node.

The fourth NMOS transistor MNN4 has a source, a gate, and a drain coupled to the low voltage source $V_{SS}$, the gate of the second NMOS transistor MNN2, and the source of the fifth NMOS transistor MNN5, respectively. The fifth NMOS transistor MNN5 has a gate and a drain coupled to the gate of the third NMOS transistor MNN3 and the first node, respectively.

The fourth and fifth NMOS transistors MNN4 and MNN5 form a first NMOS cascode of the second multiplying section 260. The second and third NMOS transistors MNN2 and MNN3 form a second NMOS cascode of the second multiplying section 260. The W/L (width to length ratio) of the fourth NMOS transistor MNN4 is N times the W/L of the second NMOS transistor MNN2. The W/L of the fifth NMOS transistor MNN5 is N times the W/L of the third NMOS transistor MNN3.

In one embodiment of the present invention, the second capacitor has a capacitance of C/2 such that the multiplied capacitance generated at the first node of FIG. 8A is $(N+1)*C/2$.

Referring to FIGS. 6, 7, and 8A, the first capacitor is connected substantially in parallel with the second capacitor. Thus, a total capacitance generated at the first node of FIG. 6 is a sum of the first multiplied capacitance generated at the first node by the first multiplying path of FIG. 7 and a second multiplied capacitance generated at the first node by the second multiplying path of FIG. 8A. Thus, for the embodiment when each of the first and second capacitors has a capacitance of C/2, the total capacitance generated at the first node is $(N+1)*C=(N+1)*C/2+(N+1)*C/2$.

Since the multiplied capacitances generated by the plurality of multiplying paths is added in FIG. 6, the total capacitance is less prone to noise and more stable.

In addition, by small-signal analysis of the circuits of FIGS. 7 and 8A, a total current in the first node is expressed as follows:

$$i_{in} = (1+N) \cdot \frac{sC}{1+s\frac{C}{g_{mn5}+g_{mp5}}} \cdot v_{in},$$

where $i_{in}$ and $v_{in}$ are a current and a voltage, respectively, at the first node, $g_{mn5}$ is a transconductance of the fifth NMOS transistor MNN5, and $g_{mp5}$ is a transconductance of the fifth PMOS transistor MPP5. Thus, a bandwidth (i.e., the −3 dB frequency) is expressed as follows: $\omega_{-3dB}=(g_{mn}+g_{mp})/C$, when each of the first and second capacitors has a capacitance of C/2. Hence, the bandwidth of the total capacitance at the first node of FIG. 6 is extended from the prior art.

Figure 8B:
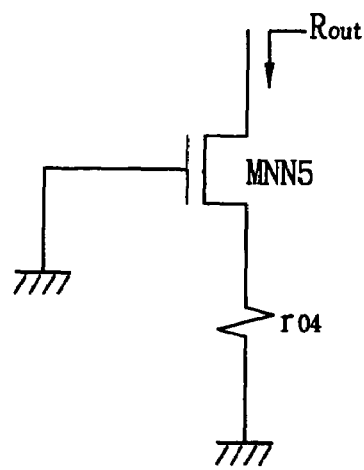
FIG. 8B is an equivalent circuit diagram for the second multiplying section of FIG. 8A for determining an output resistance $R_{out}$.
Figure 8C:
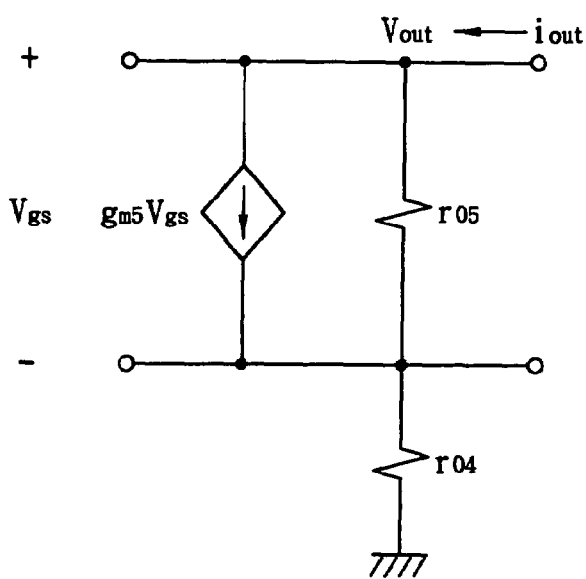
FIG. 8C is a small-signal model for the circuit of FIG. 8B.
Figure 8D:
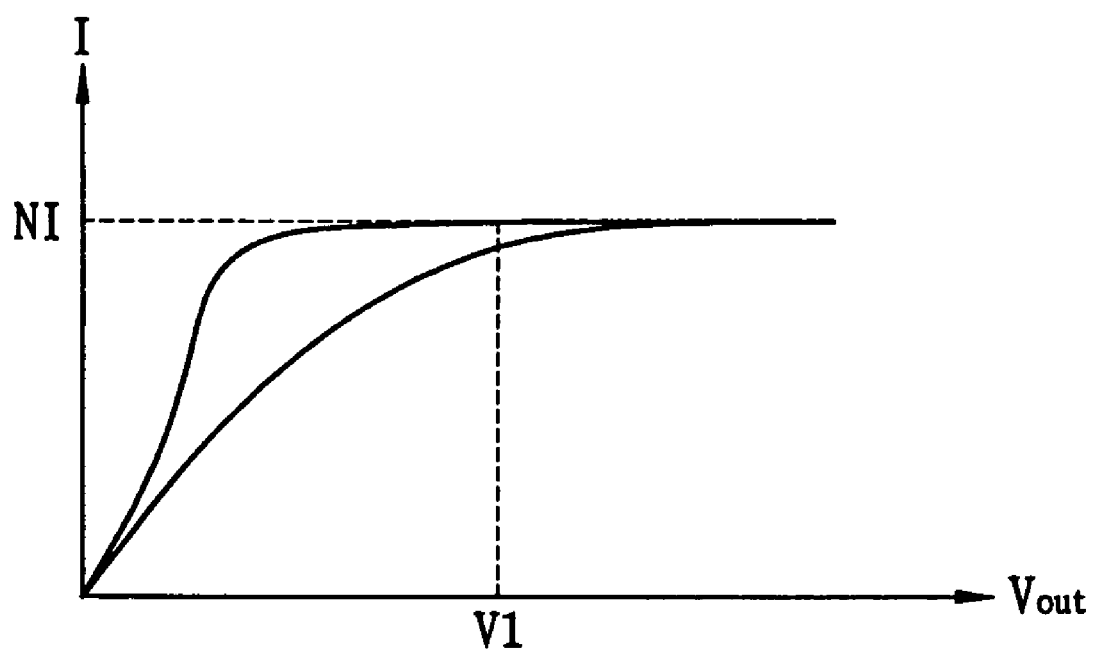
FIG. 8D shows current versus voltage characteristics at a first node of FIG. 8A.

Furthermore, FIG. 8B illustrates an equivalent circuit diagram of the second multiplying section 260 for determining an output resistance $R_{out}$ at the first node of FIG. 8A. FIG. 8C is a small-signal model for the circuit of FIG. 8B, and FIG. 8D shows current versus voltage characteristics for the first node of FIG. 8A.

Referring to FIGS. 8B and 8C, the second multiplying section 260 of FIG. 8A has the NMOS cascode comprised of the fourth and fifth NMOS transistors MNN4 and MNN5. In the small-signal model of FIG. 8B, $i_{out}$ and $v_{out}$ are a current and a voltage, respectively, at the first node. Additionally, $r_{o5}$ represents an internal resistance of the fifth NMOS transistor MNN5, and $r_{o4}$ represents an internal resistance of the fourth NMOS transistor MNN4.

By small signal analysis for the circuit of FIG. 8C:

$$\frac{v_{out}}{i_{out}} \approx g_{m5} \times r_{o4} \times r_{o5} + r_{o5}$$

In the case $$g_{m5} \times r_{o4} \gg 1, \quad \frac{v_{out}}{i_{out}} \approx g_{m5} \times r_{o4} \times r_{o5}.$$

Compared to the conventional capacitance multiplier of FIG. 1A, the output resistance at the first node is increased in FIGS. 7 and 8A with cascode loads within the multiplying sections 240 and 260. With such higher output resistance in parallel with the multiplied capacitance at the first node, more current is available to charge/discharge the multiplied capacitance for higher charging/discharging efficiency.

Referring to FIGS. 8A and 8D, if a current level, I, flows through the second and third NMOS transistors MNN2 and MNN3, a higher current level, N*I, flows through the fourth and fifth NMOS transistors MNN4 and MNN5. In one embodiment of the present invention, the capacitance multiplier of FIG. 8A is designed for a wide swing cascode configuration. In that case, the current flowing through the fourth and fifth NMOS transistors MNN4 and MNN5 is maintained to be N*I even for lower output voltages $V_{out}$ from the conventional capacitance multiplier.

The lower graph in FIG. 8D is a current versus voltage characteristic at the output node (i.e., the first node) of the conventional capacitance multiplier (such as that of FIG. 1A for example). The upper graph in FIG. 8D is the current versus voltage characteristic at the output node (i.e., the first node) of the capacitance multiplier for FIG. 8A of the present invention. Referring to FIG. 8D, in the conventional capacitance multiplier, the current level of N*I does not flow through MOS transistors at a voltage level of V1. In contrast, in the capacitance multiplier of FIG. 8A of the present invention, the current level of N*I does flow through the fifth and sixth NMOS transistors MNN5 and MNN6 even at the low voltage level of V1.

With such a wide swing cascode configuration, a lower voltage level may be applied from the high voltage source $V_{DD}$ with the current level of N*I still flowing through the cascode NMOS transistors MNN5 and MNN6. Thus, the capacitance multiplier of FIG. 8D has higher power voltage range.

Figure 10:
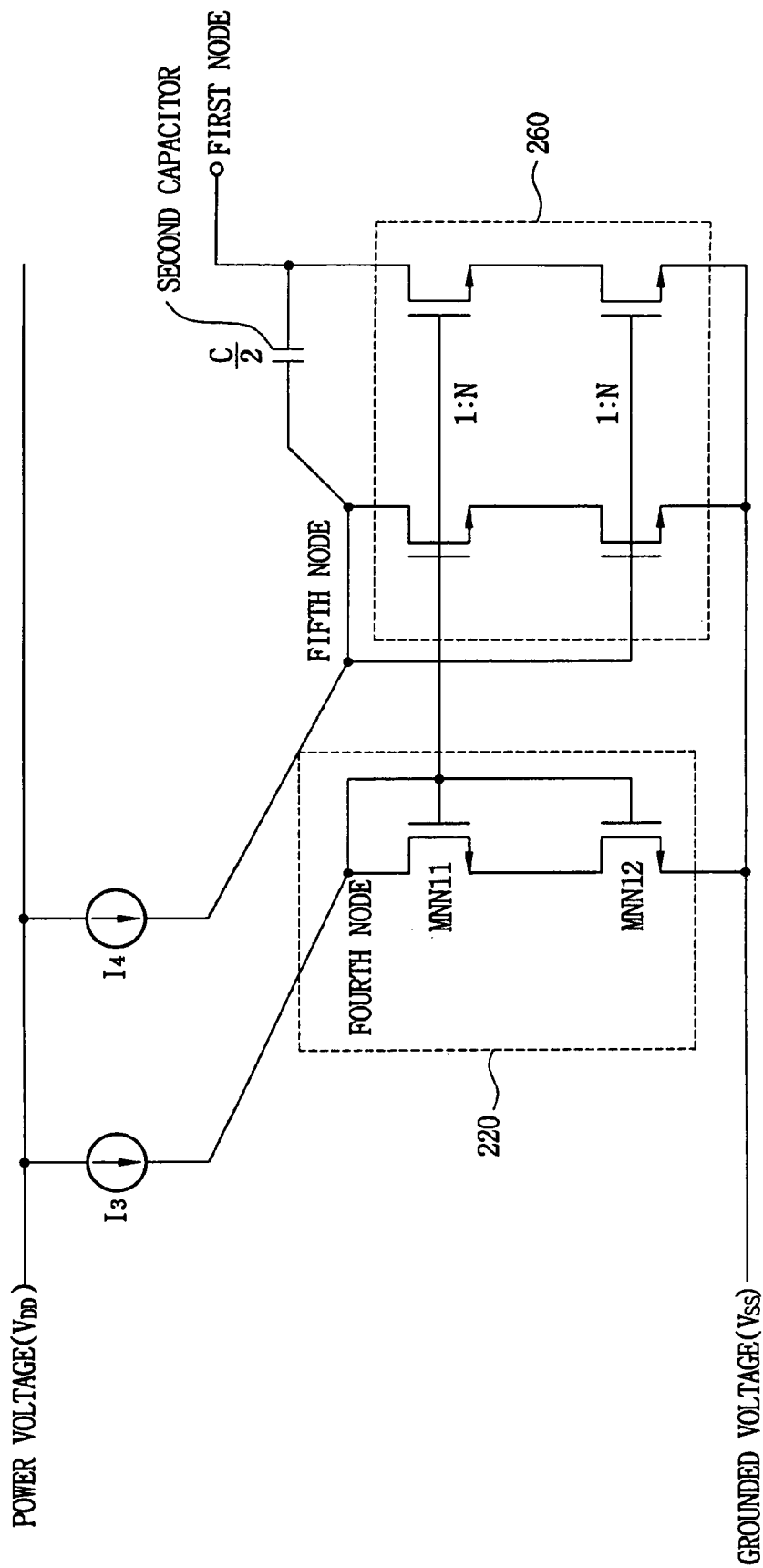
FIG. 10 is a circuit diagram of a bias current section, a second bias voltage section, and a second multiplying section of FIG. 6, according to an embodiment of the present invention.

FIG. 9 is a circuit diagram of another example embodiment of the bias current section 100, the first bias voltage section 200, and the first multiplying section 240. FIG. 10 is a circuit diagram of another example embodiment of the bias current section 100, the second bias voltage section 220, and the second multiplying section 260.

The capacitance multiplier formed by components of FIGS. 9 and 10 operates substantially similar as that formed by components of FIGS. 7 and 8A, respectively. A difference is in the implementation of the first bias voltage section 200 and the second bias voltage section 220, which is now described in detail.

The first bias voltage section 200 includes a first PMOS transistor MPP11 and a second PMOS transistor MPP12. The second PMOS transistor MPP12 includes a source, a gate, and a drain coupled to the high voltage source $V_{DD}$, the second node, and the source of the first PMOS transistor MPP11, respectively. The first PMOS transistor includes a gate and a drain coupled together to the second node. Similar to FIG. 7, the first bias voltage section 200 of FIG. 9 generates a stable bias voltage comprised of an integer number of at least one source to gate voltage $V_{SG}$ drop from the high voltage source $V_{DD}$, at the second node.

Referring to FIG. 10, the second bias voltage section 220 includes a first NMOS transistor MNN11 and a second NMOS transistor MNN12. The second NMOS transistor MNN12 has a source, a gate, and a drain coupled to the low voltage source $V_{SS}$, the fourth node, and a source of the first NMOS transistor MNN11, respectively. The first NMOS transistor MN11 has a gate and a drain coupled together to the fourth node. Similar to FIG. 8A, the second bias voltage section 220 of FIG. 10 generates a stable bias voltage comprised of an integer number of at least one gate to source voltage $V_{GS}$ drop from the low voltage source $V_{SS}$, at the fourth node.

Figure 11:
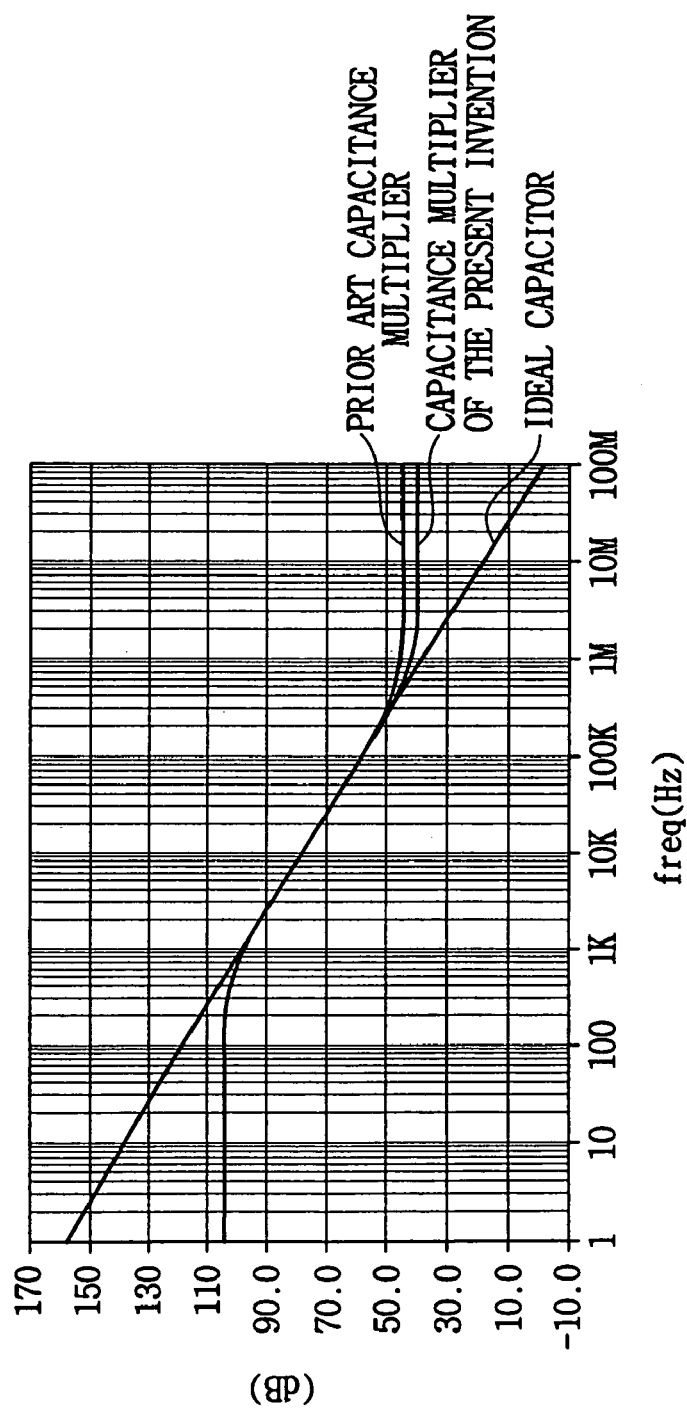
FIG. 11 is a graph showing simulation results comparing the capacitance multiplier of FIG. 6 to the capacitance multiplier of the prior art.

FIG. 11 shows simulation results for the capacitance multiplier of FIG. 6 with a plurality of multiplying paths compared to the capacitance multiplier of the prior art. In particular, N is set to 9 and the capacitance C is set to 100 pF so that a total capacitance of 1 nF is generated by the capacitance multipliers. FIG. 11 illustrates that the bandwidth for the capacitance multiplier of the present invention is higher than that for the conventional capacitance multiplier.

The foregoing is by way of example only and is not intended to be limiting. For example, the present invention may be practiced with any other types of circuit topology for the self-biasing active load that generates a bias voltage without using a separate bias current. Furthermore, the present invention may be practiced with other types of circuit topology for the multiplying section that multiplies the capacitance using the bias voltage from the self-biasing active load.

In addition, any number as illustrated and described herein is by way of example only. For example, FIG. 6 illustrates two multiplying paths, but the present invention may be practiced with any number of multiplying paths.

The present invention is limited only as defined in the following claims and equivalents thereof.

What is claimed is:

1. A capacitance multiplier comprising:
    a capacitor having a first capacitance, C, coupled between a first node and a second node;
    an active load coupled to the second node for generating a bias voltage thereon with self biasing from a first current level, I, flowing within the active load, wherein the active load is self-biasing by including only a plurality of diode-connected transistors each connected between a respective voltage source and said same one second node: and
    a multiplying section coupled to the first and second nodes for generating a second capacitance, (N+1)*C, at the first node with a second current level, N*I, flowing within the multiplying section, wherein N is a multiple of the second current level divided by the first current level.

2. The capacitance multiplier of claim 1, wherein the plurality of diode-connected transistors includes only:
    a diode-connected PMOS transistor coupled between a high voltage source and the second node; and
    a diode-connected NMOS transistor coupled between a low voltage source and the same one second node,
    wherein the first current level, I, flows through the PMOS and NMOS transistors of the active load.

3. The capacitance multiplier of claim 2, wherein a drain and a gate of the PMOS transistor are coupled together, and wherein a drain and a gate of the NMOS transistor are coupled together.

4. The capacitance multiplier of claim 2, wherein the multiplying section includes:

a PMOS transistor coupled between the high voltage source, the second node, and the first node; and
    an NMOS transistor coupled between the low voltage source, the second node, and the first node,
    wherein the second current level, N*I, flows through the PMOS and NMOS transistors of the multiplying section.

5. The capacitance multiplier of claim 4, wherein a W/L of the PMOS transistor of the multiplying section is N times a W/L of the PMOS transistor of the active load, and wherein a W/L of the NMOS transistor of the multiplying section is N times a W/L of the NMOS transistor of the active load.

6. The capacitance multiplier of claim 2, wherein a bandwidth of the capacitance multiplier is $(g_{mn}+g_{mp})/C$, with $g_{mn}$ being the transconductance of the NMOS transistor of the active load, and with $g_{mp}$ being the transconductance of the PMOS transistor of the active load.

7. A capacitance multiplier comprising:
    a capacitor having a first capacitance, C, coupled between a first node and a second node;
    an active load coupled to the second node for generating a bias voltage thereon with self biasing from a first current level, I, flowing within the active load; and
    a multiplying section coupled to the first and second nodes for generating a second capacitance, (N+1)*C, at the first node with a second current level, N*I, flowing within the multiplying section, wherein N is a multiple of the second current level divided by the first current level;
    and wherein the active load includes:
    a PMOS bias cascode of PMOS transistors coupled between a high voltage source and the second node; and
    an NMOS bias cascode of NMOS transistors coupled between a low voltage source and the second node,
    wherein the first current level, I, flows through the PMOS and NMOS bias cascodes of the active load.

8. The capacitance multiplier of claim 7, wherein the PMOS bias cascode of the active load is comprised of two PMOS transistors, and wherein the NMOS bias cascode of the active load is comprised of two NMOS transistors.

9. The capacitance multiplier of claim 7, wherein an integer number of gate to source voltage drops of the transistors of the PMOS and NMOS bias cascodes is disposed between the high and low voltage sources.

10. The capacitance multiplier of claim 7, wherein the multiplying section includes:
    a PMOS cascode of PMOS transistors coupled between the high voltage source, the second node, and the first node; and
    an NMOS cascode of NMOS transistors coupled between the low voltage source, the second node, and the first node,
    wherein the second current level, N*I, flows through the PMOS and NMOS cascodes of the multiplying section.

11. The capacitance multiplier of claim 10, wherein the PMOS cascode of the multiplying section is comprised of two PMOS transistors, and wherein the NMOS cascode of the multiplying section is comprised of two NMOS transistors.

12. The capacitance multiplier of claim 10, wherein a W/L of each of the PMOS transistors of the multiplying section is N times a W/L of each of the PMOS transistors of the active load, and wherein a W/L of each of the NMOS transistors of the multiplying section is N times a W/L of each of the NMOS transistor of the active load.

* * * * *